United States Patent
Bower, III et al.

(10) Patent No.: US 7,415,644 B2
(45) Date of Patent: Aug. 19, 2008

(54) SELF-REPAIRING OF MICROPROCESSOR ARRAY STRUCTURES

(75) Inventors: Fred A. Bower, III, Durham, NC (US); Sule Ozev, Durham, NC (US); Paul G. Shealy, Rock Hill, SC (US); Daniel J. Sorin, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 668 days.

(21) Appl. No.: 10/971,347

(22) Filed: Oct. 22, 2004

(65) Prior Publication Data

US 2006/0101303 A1  May 11, 2006

(51) Int. Cl.
 *G01R 31/28* (2006.01)
(52) U.S. Cl. .............................. 714/724; 714/5; 714/710
(58) Field of Classification Search ...................... 716/3; 714/723, 724, 5, 710; 365/173, 200
See application file for complete search history.

(56) References Cited

U.S. PATENT DOCUMENTS

| 4,484,292 | A | * | 11/1984 | Hong et al. ..................... 716/13 |
| 5,233,614 | A | * | 8/1993 | Singh .......................... 714/723 |
| 6,839,275 | B2 | * | 1/2005 | Van Brocklin et al. ....... 365/173 |
| 7,203,106 | B2 | * | 4/2007 | Versen et al. ................ 365/200 |

* cited by examiner

*Primary Examiner*—David Ton
(74) *Attorney, Agent, or Firm*—Brandon C. Kennedy; Cynthia S. Byrd; Biggers & Ohanian, LLP

(57) ABSTRACT

A level of indirection is utilized when writing to a microprocessor array structure, thereby masking hard faults in the array structure. Among other benefits, this minimizes the use of a backward error recovery mechanism with its inherent delay for recovery. The indirection is used to effectively remove from use faulty portions of the array structure and substitute spare, functioning portions to perform the duties of the faulty portions. Thus, for example, faulty rows in microprocessor array structures are mapped out in favor of substitute, functioning rows.

4 Claims, 4 Drawing Sheets

SELF-REPAIRING OF MICROPROCESSOR ARRAY STRUCTURES

BACKGROUND OF THE INVENTION

1. Field of the Invention

This invention relates to the field of self-repair of microprocessor array structures and, more particularly, to the field of masking hard faults in microprocessor array structures.

2. Description of the Related Art

In computer hardware, "hard faults" are not uncommon. Hard faults are distinguishable from "soft" or transient faults by their permanence. A hard fault is a permanent error condition that remains fixed, for example, a location on a hard drive that stores a digital "1" regardless of attempts to store something else (e.g., a digital "0") to the location. Unlike soft faults, which are transient and can be reset, a hard fault cannot be changed. As a result, they are particularly troublesome to both software and hardware designers.

As microprocessor fabrication technology continues to shrink devices and wires and increase clock frequencies, hard fault rates are consequently increasing. One reason for the increase in hard faults is the increased probability of short and open circuits due to reduced circuit sizes. These reduced circuit dimensions result in devices with increased sensitivity to effects such as electromigration and gate oxide breakdown, both sources of hard faults in a device.

There are several existing techniques for comprehensively tolerating hard faults in microprocessor cores. The simplest approach is forward error recovery (FER) via the use of redundant microprocessors in parallel, e.g., "pair and spare" or triple modular redundancy (TMR). For extreme reliability, this is an effective but not cost-efficient solution. IBM mainframes and certain systems built by Tandem and Stratus are examples of systems that use redundant processors to mask hard faults. Mainframes also replicate certain structures within the microprocessors themselves to increase reliability. The drawback of these schemes is the large added hardware expense and power usage of the redundant hardware. For non-mission-critical applications, this solution is not preferred.

Cost-effective approaches exist for comprehensively tolerating hard faults and can be far less expensive than the above-described redundancy approaches, but they often sacrifice performance in the presence of hard faults. One such approach is back-end or commit-stage error detection with backward error recovery (BER), which use end-of-pipeline checker processors to perform the detection and trigger recovery operations. Dynamic Implementation Verification Architecture (DIVA) is one example of this approach and is used to provide fault protection for traditional microprocessor core implementations. The processors utilized in these traditional microprocessors must be fast and aggressive to perform the complex operations that they are tasked to perform. DIVA and other similar systems utilize in-order technology, using a small, simple, on-chip checker processor, to protect the microprocessor from both hard and soft faults. The checker processor sits at the commit stage of the microprocessor and compares the results of its execution of each instruction to the result of execution by the microprocessor. If the results differ, the checker processor is assumed to be correct and its result is used. This assumption is based on the provably correct design of the checker processor and its relatively small size and complexity with respect to the more aggressive microprocessor. To prevent the fault in the microprocessor from propagating to later instructions, DIVA then flushes the aggressive processor's pipeline, which effectively backs processing up, on the order of a few tens of instructions, to make certain that any in-core forwarding of the faulty value is nullified and replayed with the correct value from the checker. On the replay, the correct value won't need to be forwarded in the microprocessor core because it will already be ready in the register file and will be fetched from there.

The fault-free performance of DIVA and other checker processor systems can be made virtually equal to that of the aggressive processor, since the simple checker processor can leverage the faster microprocessor as a pre-fetch engine. The small amount of redundancy of a checker processor system such as DIVA is far less expensive and power hungry than TMR. However, such systems have a performance penalty for each detected error. Every time a hard fault manifests itself as an error, the performance of the system temporarily degenerates to that of the checker processor until the microprocessor refills its pipeline. The checker processor is very slow; performance will degrade appreciably for error rates greater than one per thousand instructions. In the presence of hard faults that could get exercised frequently, performance suffers significantly.

Cost-effective approaches for tolerating only specific classes of hard faults also exist. One approach is the use of error correcting codes (ECC). ECC can tolerate up to a targeted number of faulty bits in a piece of data, and it is a useful technique for protecting SRAM, DRAM, buses, etc., from this fault model. However, ECC cannot tolerate more than a certain number of faulty bits, nor can it be implemented quickly enough to be a viable solution for many performance-critical structures in a microprocessor.

SUMMARY OF THE INVENTION

In accordance with the present invention, a level of indirection is utilized when writing to a microprocessor array structure, thereby masking hard faults in the array structure. Among other benefits, this minimizes the use of a backward error recovery mechanism with its inherent delay for recovery. The indirection is used to effectively remove from use faulty portions of the array structure and substitute spare, functioning portions to perform the duties of the faulty portions. Thus, for example, faulty rows in microprocessor array structures are mapped out in favor of substitute, functioning rows.

DETAILED DESCRIPTION OF THE PREFERRED EMBODIMENT

Figure 1:
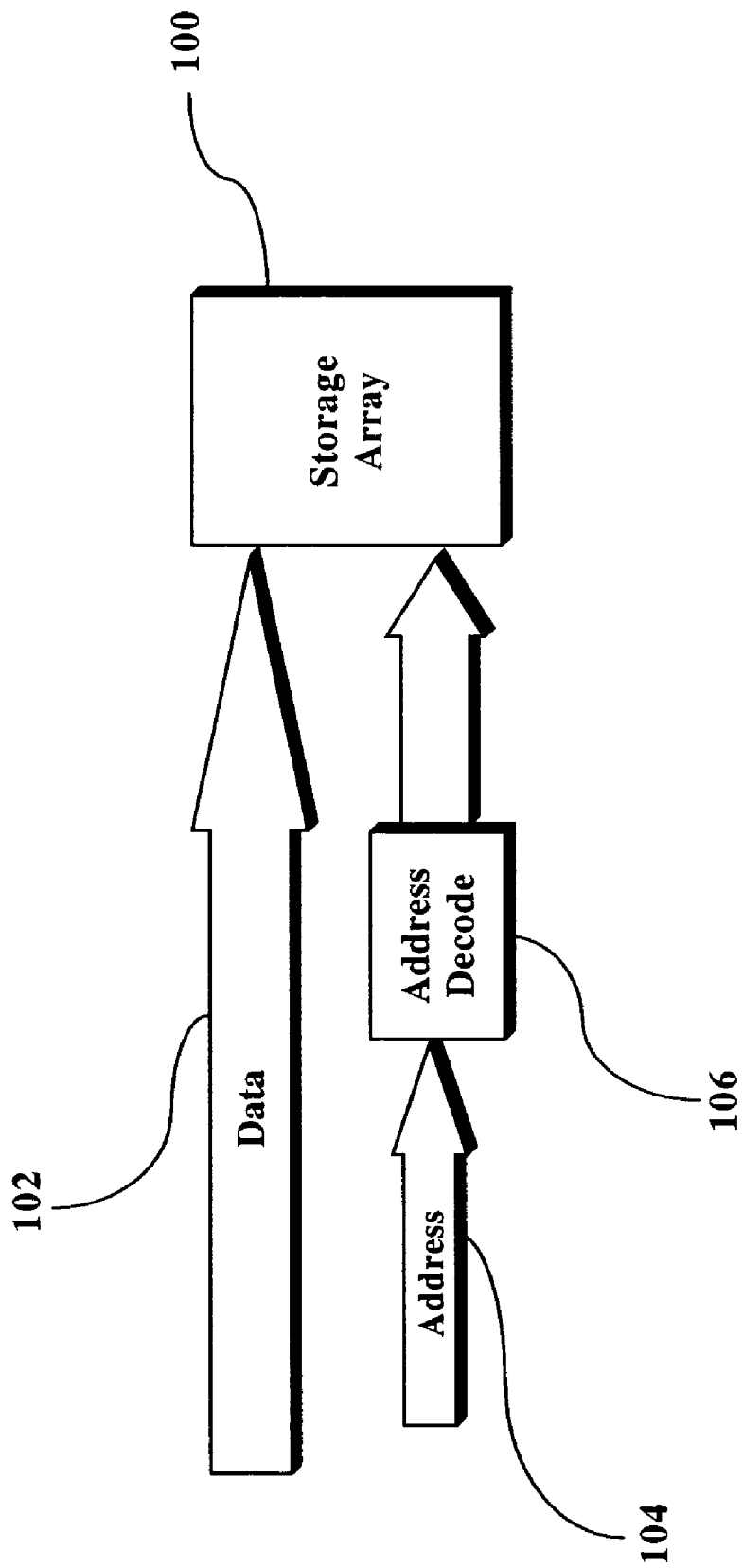
FIG. 1 illustrates a typical prior art microprocessor and the manner in which data is loaded and stored within a storage array.

FIG. 1 illustrates a typical prior art microprocessor and the manner in which data is loaded and stored within a storage array. More specifically, referring to FIG. 1, a storage array 100 receives data input 102. Simultaneously with the input, address information 104 is input to an address decoder 106. The address information contains the physical address where the data being input is to be written in the storage array 100. Address decoder 106 represents the logic that takes the address information from address information 104 and activates the proper entry in storage array 100 for writing/reading of the inbound and outbound data, i.e., it associates the input data with a particular physical address within the storage array 100. Faults in the array 100 will cause errors that are passed along down the pipeline via the data output from the array. If a BER system such as DIVA is utilized, the checker processor will identify and correct the error and flush the pipeline as described above. Thus, hard errors will repeatedly trigger any detect/correct processes invoked by such checker processors, causing delays in the system.

Figure 2:
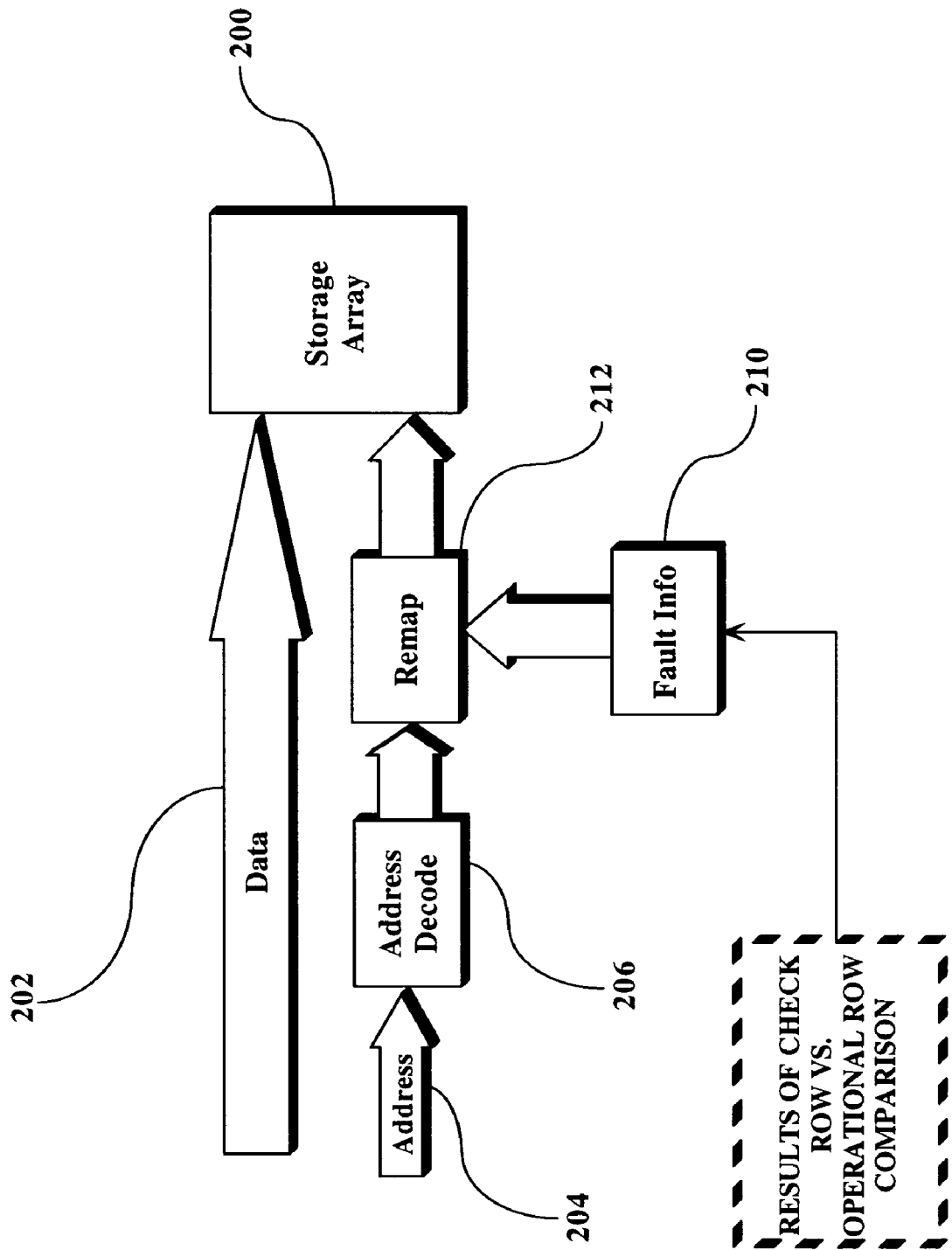
FIG. 2 illustrates the basic structure of the present invention.

FIG. 2 illustrates the basic structure of the present invention. Referring to FIG. 2, a storage array 200 receives data input 202. Similarly to the prior art shown in FIG. 1, address information 204 is input to an address decoder 206. However, in accordance with the present invention, information regarding faults occurring within the storage array 200 (fault info 210) is obtained and is input to remap logic 212. Methods for obtaining the fault information 210 are described in more detail below. Remap logic 212 takes into consideration the fault information 210 before activating a physical location within the storage array 200 for writing/reading of the input/output data. The remap logic 212 takes the fault information and performs any necessary redirection of addresses from a physical location that has been deemed faulty to its spare physical location. This novel approach assures that data is not stored in faulty physical locations.

In connection with a DIVA system or other system implementing commit-stage error detection with BER, a benefit of the present invention is that fault entries in the storage array are removed from operation, preventing repeated errors that they cause from occurring (and thus they are not detected or corrected by the detection/correction system). This results in a significant reduction in the number of corrections that must be made, thus preserving processor performance at fault-free performance levels.

Figure 3:
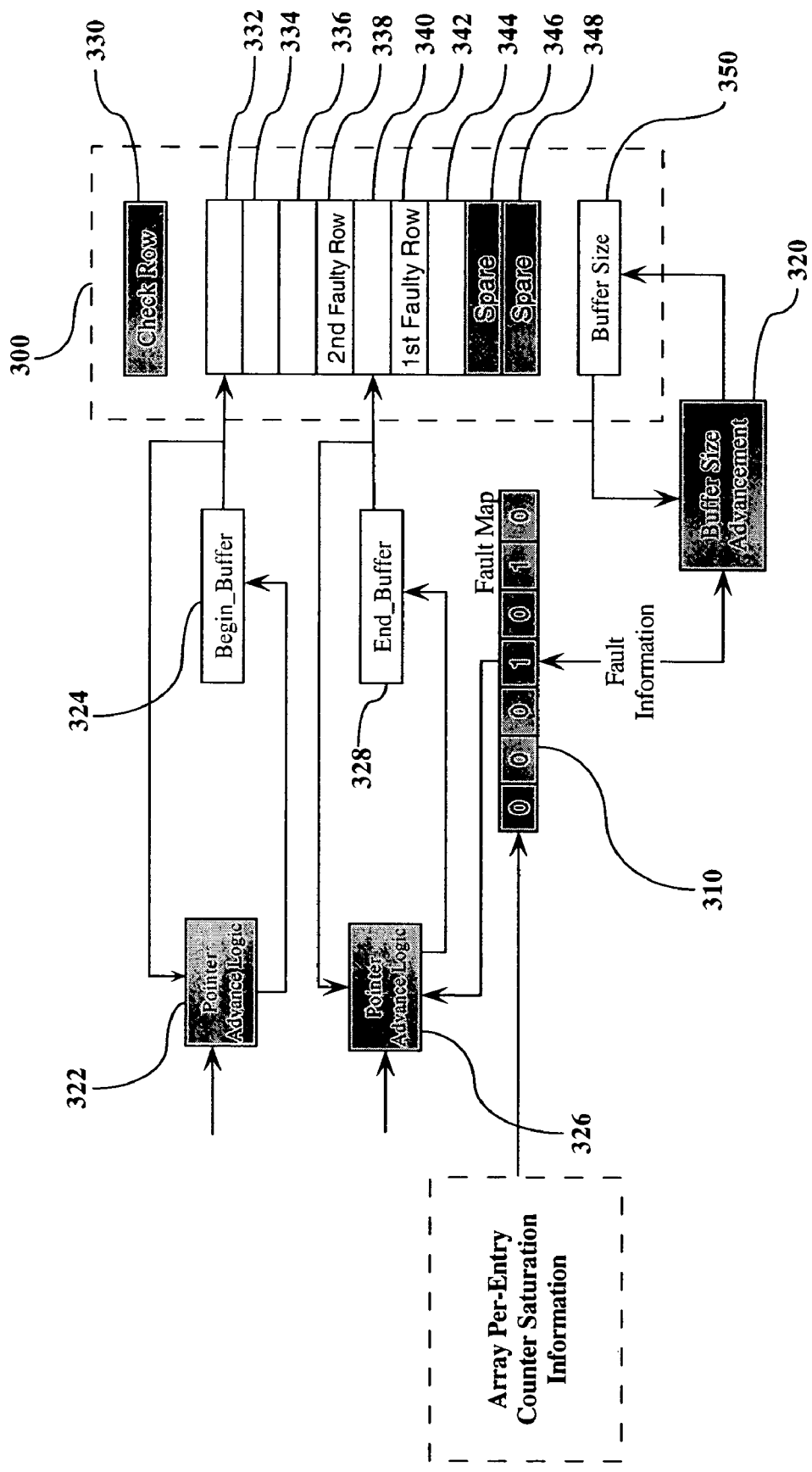
FIG. 3 illustrates an example of a first embodiment of the system of FIG. 2, utilized in connection with self-repair for buffers.

FIG. 3 illustrates an example of a first embodiment of the system of FIG. 2, utilized in connection with self-repair for buffers. The storage array 300 in this example comprises a check row 330; seven physical or "operational" rows 332, 334, 336, 338, 340, 342, and 344; spare rows 346 and 348; and buffer-size storage element 350. As is well known, a typical storage array will consist of many more than seven physical rows. Most typical storage arrays are sized in powers of two and fall between 16 and 128 rows in size. It is understood that the present invention is not limited to a storage array of any particular size, and it is contemplated that actual implementations of the present invention will have more than seven physical rows, more than two spare rows, and more than one check row.

The remap logic (212 of FIG. 2) comprises head pointer advance logic 322 and begin buffer 324, and tail pointer advance logic 326 and end buffer logic 328. Fault information 310 comprises a fault map, a bit map corresponding to the entries in the storage array.

The structure of FIG. 3 has a pointer to the first entry (the head entry) in the array and the last entry (the tail entry) in the array, described in more detail below. New entries are allocated from one end of the array and deallocated from the other end. An absolute size of the array is maintained to coordinate wrapping from the last entry back to the first entry. This absolute size is stored in buffer-size storage element 350, which can comprise a simple storage location in the array. The absolute size is referenced by the pointer advance logic, described below, so that it is known when the end of the structure has been reached and there is a need to return to the beginning.

The head pointer advance logic 322 is the portion of the remap logic associated with the head entry of the storage array. The tail pointer advance logic 326 is the portion of the remap logic associated with the tail entry of the storage array. With the exception of the entry (head or tail) the function of the tail pointer advance logic 326 is identical to that of the head pointer advance logic 322.

In the fault map of fault information 310, faulty entries are marked with a "1" and good entries are marked with a "0". This information feeds into the remap logic (head pointer advance logic 322 and tail pointer advance logic 326) as well as into the buffer size advancement logic 320. The buffer size advancement logic 320 increments the size of global buffer 350 to keep the number of non-faulty entries constant during operation. Thus, if a faulty row is identified in the fault information 310, buffer size advancement logic 320 expands the buffer size to include one of the spares, and the faulty row is taken out of operation in favor of the spare.

As shown, the storage array includes a check row for purpose of comparing stored entries in the operational rows with results stored in the check row to track where faults have been identified prior to entries being marked as permanently faulty. In the event of a permanent failure of a row, it is designated as such and a spare is designated to take its place. Under normal system operation, array entries are allocated/deallocated asynchronously from data writing/reading to the structure. This allocation process utilizes the begin buffer (324) and the end buffer (328) pointers to determine the next available entry for allocation/deallocation. These pointers are incremented/decremented after each allocation/deallocation of a buffer entry. Absolute buffer size is held in the buffer size storage element 350. As faults are discovered during operation of the invention, the fault information (310) is updated and the buffer size incremented. This causes the advancement logic for the pointers (322, 326) to skip faulty entries, and the spare entries are used to maintain absolute array capacity Data flow into and out of the array structure proceeds as under normal operation of a fault-free system as though the invention was not applied. The only part of data input/output activity that is altered is the added step of writing the data to the check row in addition to its storage location in the array. The checking of written results against the check row is performed after the writing of the data. Entry addressing is based upon the allocations previously performed by the logic just described, making involvement of fault logic unnecessary during subsequent reads and writes to the structure between allocation and deallocation.

Figure 4:
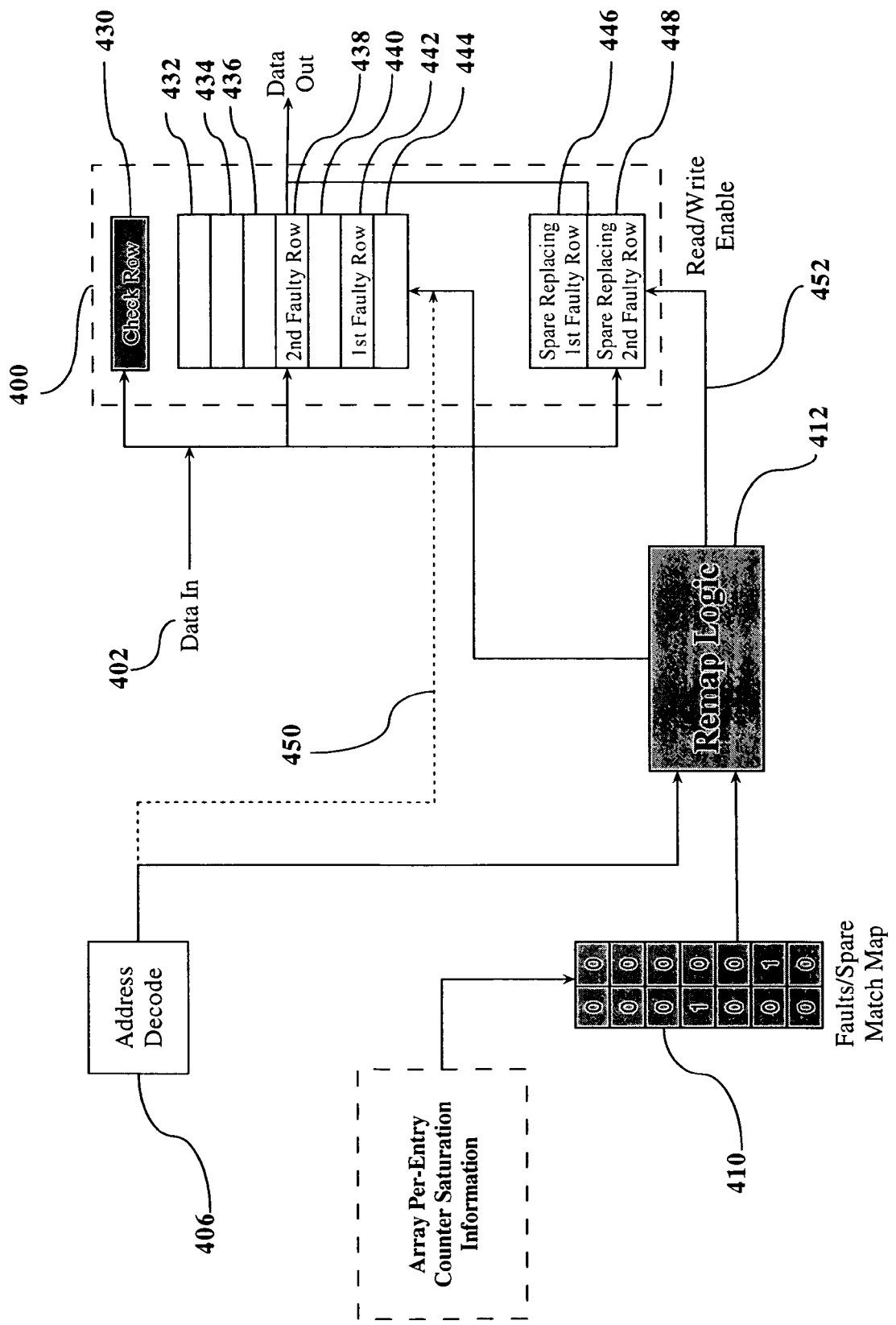
FIG. 4 illustrates an alternative embodiment of the system of FIG. 2, this time used with self-repair for tables.

FIG. 4 illustrates an alternative embodiment of the system of FIG. 2, this time used for the self-repair for tables. In this configuration, the fault/spare match-up table 410 functions analogously to the fault information 310 of FIG. 3, but is used differently by the remap logic. The remap logic 412 of the configuration of FIG. 4 sets the read/write enable for the main array entry or spare entry based upon the value in the fault/spare match map. Under normal system operation using the configuration of FIG. 4, data (402) and its associated address (or just the address in the case of a read operation) are input to the table. Address decode/selection proceeds as normal, with selection input being provided to the appropriate storage location for the data to be stored/read via pathway 450. If the table entry is determined to be faulty, the read/write enable 452 for the table is not set by the read map logic, and instead the read/write enable for the appropriate spare is enabled. In case of a write, data is always also written to the check row to enable comparison after the write cycle completes.

Referring to both the FIG. 3 and FIG. 4 embodiments, a check row is identical in structure to an operational row. Each check row is dedicated to the task of storing a redundant copy of data for purpose of comparison with the value stored in an operational row and/or a spare row. Multiple spares might be interspersed among the operational rows for proximity purposes such that the spares are local to the operational row(s) they protect. Further, spares may be dedicated to replacing a faulty check row if desired, or any spare may be allowed to replace any row, check row or operational row, depending on the needs and desires of the designer of the array.

The discussion that follows focuses on the operations and benefits of the above-described present invention, referred to as a "Self-Repairing Array System" or SRAS, and its ability to minimize the shortcomings of a commit-stage error detection with BER system, in this example, DIVA. It is understood, however, that the present invention has utility with respect to any system or method where masking of hard faults would be useful.

SRAS incorporates a simple scheme for detecting row errors and diagnosing which row is faulty. By adding a plurality of check rows (some are spares, which are used to avoid a single point of failure) to each structure to be protected, every time an entry is written to the array structure, the same data is also written into a check row. Immediately after the two writes, both locations are read and their data are compared (all off the critical path of execution). If the data differ, then one of the rows is faulty. Several options exist for determining which row is faulty; a simple option is described below.

SRAS maintains small saturating counters for each row, which are periodically reset, and a counter value above a threshold identifies a hard fault. To determine if the operational row or the check row is faulty, both of their counters can be incremented in the case of a mismatch in their values, as long as the threshold for check row counters is set to be much higher than that for operational rows.

If an error is detected, but the hard fault threshold has not yet been reached, then the fault is considered to be transient and it is tolerated by DIVA with its associated performance penalty. If the detected error raises the counter to the hard fault threshold, then DIVA also tolerates this fault, but in accordance with the present invention, the system repairs itself so as to prevent this hard fault from being exercised again. The repair actions taken depend on whether the faulty row is a non-check row (i.e., operational) or a check row. If it is a non-check row, then it can be immediately mapped out and a spare row can be mapped in to take its place. The spare row obtains the correct data from the check row. If the faulty row is a check row, then SRAS maps in a spare check row.

Array structures within a microprocessor core can be classified into two categories: non-addressable buffers for which the data location is determined at the time of access (as shown in FIG. 3), and randomly addressable tables for which the data location is determined before access (as shown in FIG. 4). A reorder buffer (ROB) is an example of an array structure like that of FIG. 3; a branch history table (BHT) is an example of an array structure like that of FIG. 4. Both are discussed herein. In order to allow timing efficient implementation of the repair logic, these distinct features of each type of array structures can be exploited.

The ROB is a circular buffer that is used in dynamically scheduled (a.k.a. "out-of-order") processors to implement precise exceptions by ensuring that instructions are committed in program order. There is an entry in the ROB for each in-flight instruction, and there are pointers to the head and tail entries in the ROB. An entry is added to the tail of the ROB once it has been decoded and is ready to be scheduled. An entry is removed from the head of the ROB when it is ready to be committed. Examples of processors that perform explicit register renaming with a map table are the Pentium4 and the Alpha 21364, in which a ROB entry contains the physical register tags for the destination register and the register that can be freed when this instruction commits, plus some other status bits.

ROB sizes are on the order of 32-128 entries, which is large enough to have a non-negligible probability of a hard fault. The ROB is a buffer which cannot be randomly addressed, and this constraint is leveraged in the remapper implementation illustrated in FIG. 3. The ROB has a high architectural vulnerability factor, in that a fault in an entry is likely to cause an incorrect execution. However, a fault in an ROB entry is not guaranteed to cause an incorrect execution for its instruction, since the fault might not change the data (i.e., logical masking) or the ROB entry might correspond to a squashed instruction (i.e., functional masking).

The Branch History Table (BHT) is a table that is accessed during branch prediction. Common two-level branch predictor designs use some combination of the branch program counter (PC) and the branch history register (BHR) to index into a BHT. The BHR is a k-bit shift register that contains the results of the past k branches. The indexed BHT entry contains the prediction (i.e., taken or not taken, but not the destination). A typical BHT entry is a 2-bit saturating counter that is incremented (decremented) when the corresponding branch is taken (not taken). A BHT value of 00 or 01 (10 or 11) is interpreted as a not-taken (taken) prediction. BHRs and/or BHTs can be either local (one per branch PC), global (shared across all branch PCs), or shared (by sets of branch PCs). The g share two-level predictor has the BHT indexed by the exclusive-OR of the branch PC and a global BHR. The BHT has an architectural vulnerability factor of zero, in that no fault in it can ever lead to incorrect execution. Thus, DIVA will never detect faults in it. However, a BHT fault can lead to incorrect branch predictions, which can degrade performance.

Remapper implementations for the ROB and BHT examples discussed above are now described. In buffer structures, as in the case of the ROB, the address of the data to be accessed is determined at the time of the access. Typically, two pointers are used to mark the head and the tail location of the active rows. When a new entry is added, the tail pointer is advanced and the corresponding address becomes the physical address of the data. Similarly, when an entry is removed, the head pointer is advanced. Thus, the physical as well as logical address of the data is abstracted and all rows have the same functionality. Thus, the faulty row can easily be mapped out by modifying the pointer advancement logic when a hard fault is detected. As described above, FIG. 3 illustrates the implementation of a self-repair mechanism for buffers in accordance with the present invention. SRAS uses a fault map bit-array to track faulty rows. If a row is determined to contain a hard fault, the corresponding bit in the fault map is modified. The fault map is used by the pointer advancement circuit to determine how far the pointer needs to be advanced. Once the pointer is updated accordingly, reads and writes of the buffer entries proceed unmodified. Since the pre-processing for pointer advancement can be done off the critical path, the proposed modification does not impact the read or write access time. In order to avoid a reduction in the effective buffer size due to hard faults, spare rows can be used. Since there is no need to replace the faulty row with any particular spare row, the detection of the faulty row prompts incrementing the total buffer size by one (by adding the spare) while maintaining the same effective size. SRAS can tolerate as many hard faults as there are spares without any degradation of buffer performance. If the number of faulty rows exceed the number of spare rows, then the effective buffer size is allowed to shrink, resulting in graceful degradation of the buffer performance. Assuming that adding one or two to the pointers does not dramatically change timing or power consumption, the only overhead of this repair mechanism is the small additional area taken by the fault map and the additional power consumed for pointer pre-processing, updating fault map entries, and updating the buffer size.

In tables such as the BHT implementation illustrated in FIG. 4, the logical address of the data is determined by the program execution prior to accessing the data. Since rows do not have equal functionality in tables, a faulty row needs to be replaced by a specific spare row. In this case, a logical indirection is needed to map out the faulty rows. In microprocessor array structures, logic inserted into the critical path directly impacts performance, so a timing-efficient repair mechanism is implemented. In SRAS, spare rows can be distributed over sub-arrays of the table, and the system can be configured so that a spare can only replace a row within its own sub-array. This choice enables timing efficient implementation of the repair logic, as shown in FIG. 4. Similar to the buffer embodiment of FIG. 3, fault map information is stored in a table. However, an extended fault map is used which also stores the faulty-row/spare matching information. If a row is identified as faulty and an unused spare is found to replace it, the corresponding entry of the fault/spare match map is set to 1. The address decode logic, which is present in all tables, enables a row of the table to be read or written by generating the individual read/write enable signals for the table rows. During a read or write access, these signals are modified by the remap logic to generate the updated read/write enable signals for the table entries as well as the read/write enable signals for the spare entries. The remap logic consists of (nxk) 2-input AND gates and k n-input OR gates, where n is the size of the sub array and k is the number of spares assigned to that sub array. Once a read/write signal is initiated by the address decode logic, this signal is "AND" ed with the corresponding entries of the fault/spare match map. If an entry is "1", that spare replaces the row currently accessed. In this case, the spare replacing the faulty row will get activated for the access.

To disable access to the faulty row, the bits in a row of the fault/spare match map are "NOR" ed and this signal is "AND" ed with the original read/write enable signal. SRAS adds two gate delays (one OR and one AND gate delay) to the table access time. Since the additional level of indirection for accessing the physical table entries is on the critical path, this additional time should not be ignored. In order to avoid set-up or hold time violations, a second pipeline stage can be used to access the table entries. This additional pipeline stage may impose a penalty in the normal mode of operation. While the actual performance penalty will likely be far less than a pipeline stage (e.g., if BHT access latency is not the determining factor in pipeline stage latency), this design point is selected in a preferred embodiment as a lower bound on SRAS's benefit.

With respect to detection and diagnosis of faults, the process is the same for tables (e.g., BHT's) and buffers (e.g., ROB's). While only k check rows are needed in a k-way superscalar processor to detect and diagnose faults, the SRAS implementation may necessitate having even more check rows. Having only k check rows could lead to an unreasonably long delay to transfer the data along wires from one end of the array to the other. Wire delays are already a problem in multi-GHz microprocessors—for example, the Intel Pentium4 has multiple pipeline stages allocated strictly to wire delay. A simple option is to divide the array into sub-arrays, each of which has k check rows.

It will be understood that each element of the illustrations, and combinations of elements in the illustrations, can be implemented by general and/or special purpose hardware-based systems that perform the specified functions or steps, or by combinations of general and/or special-purpose hardware and computer instructions.

These program instructions may be provided to a processor to produce a machine, such that the instructions that execute on the processor create means for implementing the functions specified in the illustrations. The computer program instructions may be executed by a processor to cause a series of operational steps to be performed by the processor to produce a computer-implemented process such that the instructions that execute on the processor provide steps for implementing the functions specified in the illustrations. Accordingly, FIGS. 1-4 support combinations of means for performing the specified functions, combinations of steps for performing the specified functions, and program instruction means for performing the specified functions.

The above-described steps can be implemented using standard well-known programming techniques. The novelty of the above-described embodiment lies not in the specific programming techniques but in the use of the steps described to achieve the described results. Software programming code which embodies the present invention is typically stored in permanent storage of some type, such as permanent storage of a system in which the present invention is installed. In a client/server environment, such software programming code may be stored with storage associated with a server. The software programming code may be embodied on any of a variety of known media for use with a data processing system, such as a diskette, or hard drive, or CD-ROM. The code may be distributed on such media, or may be distributed to users from the memory or storage of one computer system over a network of some type to other computer systems for use by users of such other systems. The techniques and methods for embodying software program code on physical media and/or distributing software code via networks are well known and will not be further discussed herein.

Although the present invention has been described with respect to a specific preferred embodiment thereof, various changes and modifications may be suggested to one skilled in the art and it is intended that the present invention encompass such changes and modifications as fall within the scope of the appended claims.

We claim:

1. A method for managing faults in a microprocessor array having a plurality of writeable, readable rows, comprising the steps of:

designating a first of said rows as an operational row and a second of said rows as a check row;

performing a first write operation to said first row and said second row;

after said first write operation, performing a first read operation on said first row and said second row to obtain a first read result and a second read result, respectively; and comparing said first read result to said second read result, whereby:

if said first read result is the same as said second read result, designating neither said first row nor said second row as being faulty; and if said first read result is different from said second read result, designating both said first row and said second row as being faulty.

2. The method of claim 1, further comprising the steps of:

keeping a record of each time each row is designated as being faulty; and comparing said record with a hard-fault threshold, wherein:

if said hard-fault threshold is met for a particular row, said particular row is determined to be in a hard fault condition.

3. The method of claim 2, further comprising the step of:

designating one or more of said rows as spare rows, whereby when a particular row is determined to be in a hard fault condition, mapping said particular row out of said array and mapping in one of said spare rows as a replacement row for said particular row.

4. The method of claim 3, wherein the second read result is written to said spare row mapped in as a replacement row.

\* \* \* \* \*